Dec. 2, 1958

A. P. KORDALEWSKI 2,862,840

SEMICONDUCTOR DEVICES

Filed Sept. 26, 1956

INVENTOR:
ANDREW P. KORDALEWSKI,

BY Julius J. Zaskalicky
HIS ATTORNEY.

2,862,840
Patented Dec. 2, 1958

2,862,840

SEMICONDUCTOR DEVICES

Andrew P. Kordalewski, Fayetteville, N. Y., assignor to General Electric Company, a corporation of New York Application September 26, 1956, Serial No. 612,131

8 Claims. (Cl. 148—1.5)

This invention relates in general to semiconductor devices and to methods for making the same and has as a particular object thereof to provide improvements in junction transistors of the alloy type and methods of making the same.

Junction transistors, when functioning in a grounded emitter configuration, have a current amplification factor which initially increases to a maximum and thereafter rapidly decreases as collector current is increased. This phenomenon is described by W. M. Webster in an article entitled, "On the Variation of Junction Transistor Current Amplification Factor with Emitter Current," in "Proceedings of I. R. E.," June 1954. The characteristic of decreasing current amplification with increasing collector current renders such devices disadvantageous in operation at high collector currents. It has been recognized that the extent of variation of the current amplification factor with collector current can be minimized by increasing the ratio of majority carrier concentration in the emitter region to the majority carrier concentration in the base region of a tansistor or, expressed in other words, by inceasing the overall emitter efficiency. The emitter efficiency for a particular emitter current is defined as the ratio of emitter current due to minority carrier injection into the base region of a transistor to total emitter current.

Accordingly, it is another object of the present invention to provide a transistor having a very high ratio of majority carrier concentration in the emitter region of a transistor device to the majority carrier concentration in the base region.

In P–N–P junction transistors indium is commonly employed as the acceptor activator material for forming the emitter and collector P-type conductivity regions. Indium is alloyed with portions of the body of N-type germanium and recrystallized to form the P-type regions in the body. Indium is used because of the ease with which P–N junctions may be formed thereby. Some of the properties of indium which make it desirable for such use are its low vapor pressure, its softness which reduces mechanical strain during the alloying and recrystallizing operation and its ability to readily wet the surface of the germanium in a manner that is readily controllable. However, the segregation coefficient and solid solubility of indium in germanium is relatively low; consequently the concentration of the indium, and hence majority carriers, in the recrystallized emitter region is relatively low.

It has been proposed, in order to increase the majority carrier concentration in the emitter region, to use aluminum and gallium, individually and alloyed with other acceptor or neutral materials, to form P-type conductivity regions. Since both aluminum and gallium have much higher segregation coefficients and solid solubility constants than indium, it would be possible to recrystallize a larger portion of these materials in the germanium with the result that much higher majority carrier concentrations in the emitter region of the transistor would be obtained. However, such materials as aluminum and gallium are more difficult to alloy with germanium than indium. Gallium, for example, is molten at room temperature and it is also difficult to alloy appreciable quantities of gallium with most other soft metals. Aluminum, for example, quickly forms an oxide surface which makes alloying difficult. Additionally, when aluminum is alloyed with germanium, it forms a highly brittle eutectic which makes penetration control difficult and causes severe mechanical strains in the resultant device.

Accordingly, a still further object of the present invention is to provide a transistor device which has the high quality of junction characteristic of junctions formed from indium and at the same time has the emitter efficiency characteristic of junctions formed of such materials as gallium or aluminum.

A further object of the present invention is to provide a new and improved transistor device with greater over-all emitter efficiency.

A still further object of the present invention is to provide a new and improved transistor in which departures from maximum current amplification as a function of collector current are minimized.

In carrying out this invention in one illustrative form thereof, a portion of indium is alloyed and recrystallized into a body of N-type conductivity germanium to form a first region of P-type conductivity therein. An additional portion of indium containing a small percentage of aluminum or gallium is then alloyed and recrystallized into said first region of P-type conductivity in a manner to form another region of more strongly P-type conductivity in said first region without altering the P–N junction between the N-type conductivity material of said body and said first region of P-type conductivity.

These and other advantages of this invention will be more clearly understood from the following description taken in connection with the accompanying drawings, and its scope will be apparent from the appended claims.

Figures 1, 2, 3, 4, 5:
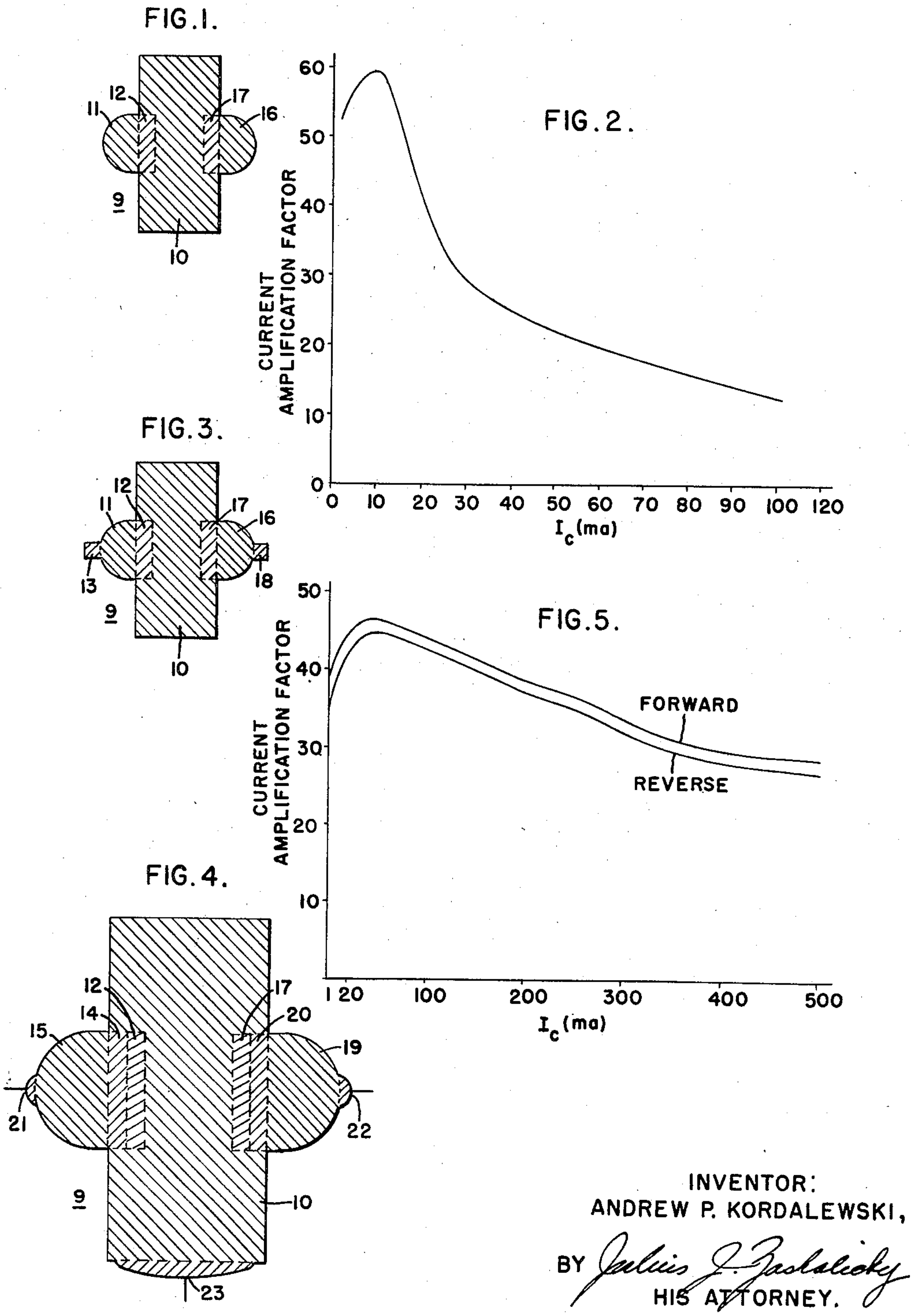
Figure 1 represents one stage in the formation of an alloy junction transistor in accordance with the present invention and shows a device in which a pair of indium dots have been alloyed into an N-type germanium wafer to form a pair of P-type conductivity regions in the wafer separated by an N-type conductivity region.
Figure 2 shows a graph of current amplification factor versus collector current for the device shown in Figure 1 were suitable base, emitter and collector connections made to it and were it incorporated in a grounded emitter circuit configuration.
Figure 3 represents another stage in the formation of an alloy junction transistor device in accordance with the present invention and shows the device of Figure 1 to which an alloy of indium and aluminum has been added to the original indium dots.
Figure 4 represents the final stage in the formation of a P–N–P alloy junction transistor in accordance with this invention and shows the added indium and aluminum alloyed to a depth just short of the junction formed in Figure 1.
Figure 5 shows graphs of current amplification factor versus collector current for the device of Figure 4 in a grounded emitter circuit configuration.

Referring now to Figure 1, a P–N–P alloy junction device 9 is shown. Device 9 is made by alloying indium dots 11 and 16 into opposite sides of a body of N-type germanium 10 to form recrystallized layers or regions 12 and 17, respectively, of P-type conductivity, either region of which may be used as an emitter of a transistor formed from the device. Semiconductors are termed N-type or P-type according to whether the movable charges normally present in excess in the material are electrons or "holes," respectively. Holes are positive charge carriers and are usually thought of as a "defect" of electrons.

The graph of Figure 2 shows the change in current amplification factor with increasing collector current for the device shown in Figure 1 were suitable base, emitter and collector connections made to it and were it incorporated in a grounded emitter circuit configuration. It should be noted that at high collector currents the current amplification factor decreases sharply with an increasing collector current. It has been recognized that this is due to a decrease in emitter efficiency with increase in emitter, and hence also collector, current. It has also been recognized that improvement in emitter efficiency would improve the aforementioned current amplification factor characteristic.

This may be accomplished by increasing the majority carrier or "hole" concentration in the P-type regions 12 and 17. In order to accomplish this, aluminum or gallium is added to the indium dots 11 and 16. Since aluminum and gallium have segregation coefficients approximately 100 times greater than that of indium in germanium, and also have solid solubility constants greater than that of indium, they may be assimilated in a recrystallized zone more readily than indium to produce stronger P-type conductivity regions, i. e. a higher "hole" density. Aluminum, because of its greater solid solubility in germanium, is more desirable for use than indium. Due to this desirable property, aluminum is described in the present embodiment. It, of course, is understood that gallium could be used if desired. Figure 3 shows the addition of dots 13 and 18 to the initial indium dots 11 and 16, respectively. Dots 13 and 18 contain indium and a small percentage of aluminum.

Dots 13 and 18 are then alloyed into the recrystallized regions 12 and 17. The maximum alloying temperature in the second alloying operation is selected to be 30° to 50° C. lower than that of the alloying temperature used to form the initial junctions and the duration of the alloying and recrystallization operation is selected to be appreciably less than the duration used to form the initial junction. Consequently, during the second alloying operation only a portion of the recrystallized regions 12 and 17 melt, leaving the established area and spacing between regions 12 and 17 undisturbed.

Figure 4 shows device 9 after the second alloying step has been completed. Regions 12 and 17 are obtained by alloying indium to the N-type germanium to form the P-type recrystallized regions of germanium containing indium atoms. Regions 14 and 20 are P-type recrystallized zones formed during the second alloying step and contain germanium impregnated with indium and aluminum atoms. While the separation of the junction between regions 10 and 12 and the junction between regions 12 and 14 are not critical, preferably the latter junction is formed as close to the former junction without the disturbing the former junction. The same requirement applies to the junctions between regions 10, 17 and 20 should it be desired to use regions 17, 20 as an emitter. Dots 15 and 19 which were reconstituted by the addition of aluminum contain both indium and aluminum. Ohmic connections 21 and 22 are made to dots 15 and 19, respectively, and an ohmic connection 23 is made to base electrode 10 to form a transistor.

Since aluminum has a greater segregation coefficient and a solid solubility constant with reference to germanium than indium, recrystallized regions 14 and 20 have relatively larger quantities of assimilated aluminum than regions 12 and 17 have of assimilated indium. Thus more P-type or positive conduction carriers are made available in regions 14 and 20. Accordingly, the efficiency of regions 12, 14 and 17, 20 as emitters is increased because of the higher concentrations of P-type or majority carriers in these regions. Also, since the second alloying step was performed at a lower temperature and in a shorter time to leave the P–N junction formed by indium alone undisturbed, the good quality of P–N junction characteristic of junctions formed from indium is retained.

Figure 5 shows a pair of graphs of current amplification factor for the device of Figure 4 connected in a grounded emitter circuit configuration versus increasing collector current. One graph labeled "forward" represents the amplification factor versus collector current characteristic when regions 12, 14 function as emitters and the other graph labeled "reverse" represents the amplification factor versus collector current characteristic when regions 17, 20 function as emitters. It should be noted that the fall-off in amplification factor with increasing collector current is reduced sharply making the device suitable for higher current amplifications. The fall-off in amplification of this particular device was designed not to exceed 30 percent from the maximum value to its value at 200 milliamperes of collector current. It should be noted that gain variations are almost the same either in the forward or reverse direction showing that either regions 12, 14 or regions 17, 20 may be used as the emitter. Accordingly, a bilateral device, i. e. a device in which either regions 12, 14 or regions 17, 20 may be used as emitters, which may be operated at high current levels has been provided. This would be particularly advantageous for single channel two-way amplification applications. Of course, if desired, only one of the regions 12 or 17 might have had second layers or regions 14 and 20, respectively, formed therein.

As one specific example of the embodiment shown in Figure 4, a P–N–P type alloy junction transistor was made by alloying a pair of indium pellets having a diameter of 0.044 of an inch and a thickness of 0.010 of an inch to a wafer of N-type conductivity germanium having a resistivity of 2 to 4 ohm-centimeters and a thickness of 0.0052 of an inch. The alloying was accomplished by gradually raising the temperature of the germanium wafer with the indium pellets thereon from room temperature to a maximum temperature of 585° C. and then allowing the temperature to fall gradually to room temperature. The duration of the heating cycle used was about 22 minutes. Additional pellets which included approximately 2 percent of aluminum to indium were applied to the initial indium pellets and an alloying operation was again performed. In the second alloying step, the temperature was gradually raised to 550° C. and remained at that point for approximately one minute. Then the temperature was allowed to decrease gradually. This step forms the second pair of layers which include indium, aluminum and germanium. In a device formed in accordance with the above specifications, the initially formed junctions were separated by about 0.001 of an inch and the regions constituted of germanium-indium alloy corresponding to regions 12 and 17 in Figure 4 where about 0.0005 of an inch thick. It should be noted that the temperatures specified are not critical. The temperature-time cycles depend on the thickness of the germanium wafer used and the amount of indium initially used. Normally, increases in thickness of the germanium wafer or decreases in amount of indium used would of necessity require an increase in temperature to obtain a base region, the region between layers 12 and 17, of the same thinness. The total amount of aluminum which may be added may vary between 0.1 to 10 percent of the total indium in the reconstituted dot. These values are not critical.

The bilateral transistor embodied in this invention utilizes the excellent wetting properties of indium to make a high quality and uniform barrier with the N-type germanium. It also provides the advantage of using materials having higher segregation coefficients and solid solubility constants than indium, such as aluminum and gallium, to enhance the emitter efficiency of transistor devices, thereby making it possible to operate such devices advantageously at higher current levels.

Since other modifications varied to fit particular operating requirements and environments will be apparent to those skilled in the art, for example, the initial regions of P-type conductivity may be formed by rate growing or diffusion techniques well known in the art instead of the alloying technique described herein, the invention is not considered limited to the examples chosen for purposes of disclosure and covers all changes and modifications which do not constitute departures from the true spirit and scope of this invention.

What I claim as new and desire to secure by Letters Patent of the United States is:

1. The method of forming an emitter in a body of semiconductor material of one conductivity type comprising alloying and recrystallizing into said body an activator material of the opposite conductivity-inducing type to form a first region of said opposite conductivity type in said body, alloying and recrystallizing another activator material having higher solid solubility in said semiconductor material and of said opposite conductivity inducing type in said first region of said body to form a second region therein of more strongly opposite conductivity type.

2. The method of forming an emitter in a body of semiconductor material of N-type conductivity comprising alloying and recrystallizing into said body a P-type activator material of the opposite type to form a first region of P-type conductivity in said body, alloying and recrystallizing another P-type activator material having higher solid solubility in said body of semiconductor material in said first region of said body to form a second region therein of more strongly P-type conductivity.

3. The method of forming an emitter in a body of semiconductor material of N-type conductivity comprising alloying and recrystallizing into said body a quantity of indium to form a first region of P-type conductivity therein, alloying and recrystallizing another activator material consisting of indium and a quantity of aluminum into said first region of said body to form a second region therein of more strongly P-type conductivity.

4. The method of forming an emitter of high injection efficiency in a body of semiconductor material of one conductivity type comprising fusing and recrystallizing a region of opposite conductivity type in said body, fusing and recrystallizing into said region an activator material of said opposite inducing conductivity type and having a higher solid solubility in said semiconductor material than the activator rendering said first region of said opposite conductivity type to form in said first region a second region of more strongly opposite conductivity type than said first region.

5. The method of forming an emitter region of one conductivity type in a body of semiconductor material of the opposite conductivity type comprising alloying and recrystallizing into said body a pellet of activator material of said one conductivity inducing type to form a first layer of said one conductivity type in said body, alloying and recrystallizing another activator material of said one conductivity inducing type into said first layer to form a second layer of said one conductivity type in said first layer.

6. The method of forming an emitter region of one conductivity type in a bar of semiconductor material of the opposite conductivity type comprising alloying and recrystallizing into said bar a quantity of activator material of one conductivity inducing type to form a first layer of said one conductivity type in said bar, adding to said first quantity of activator material a second quantity of activator material of the same conductivity type as said first quantity of activator material and having a higher segregation coefficient in said semiconductor material than said first quantity of activator material, alloying and recrystallizing said second quantity of activator material into said bar to form a second layer of opposite conductivity type contiguous with said first layer.

7. The method of forming a P-N-P type alloy junction transistor in a body of N-type conductivity germanium comprising alloying and recrystallizing a pellet of indium into one side of said body to form a first layer of P-type conductivity, alloying and recrystallizing another pellet of indium into the opposite side of said body to form a second layer of P-type conductivity separated from said first layer, adding an acceptor activator material having a higher segregation coefficient in germanium than indium to said one pellet of indium, alloying and recrystallizing said acceptor activator into said first layer to form a third layer of P-type conductivity in said first layer.

8. The method of forming a P-type conductivity junction region in a bar of N-type germanium comprising alloying and recrystallizing into said bar a pellet of indium to form a first layer of P-type conductivity in said bar, adding to said pellet of indium a quantity of an indium-aluminum alloy, alloying and recrystallizing said indium-aluminum alloy into said bar to form a second layer more strongly P-type conductivity than said first layer.

References Cited in the file of this patent

UNITED STATES PATENTS

| | | |
|---|---|---|
| 2,623,102 | Shockley | Dec. 23, 1952 |
| 2,701,326 | Pfann et al. | Feb. 1, 1955 |
| 2,725,315 | Fuller | Nov. 29, 1955 |